(12) United States Patent
Chen et al.

(10) Patent No.: US 7,683,478 B2
(45) Date of Patent: Mar. 23, 2010

(54) HERMETIC SEAL AND RELIABLE BONDING STRUCTURES FOR 3D APPLICATIONS

(75) Inventors: Kuan-Neng Chen, White Plains, NY (US); Bruce K. Furman, Pouquag, NY (US); Edmund J. Sprogis, Underhill, VT (US); Anna W. Topol, Jefferson Valley, NY (US); Cornelia K. Tsang, Mohegan Lake, NY (US); Matthew R. Wordeman, Kula, HI (US); Albert M. Young, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 12/026,776

(22) Filed: Feb. 6, 2008

(65) Prior Publication Data

US 2008/0142958 A1    Jun. 19, 2008

Related U.S. Application Data

(62) Division of application No. 11/534,366, filed on Nov. 3, 2006.

(51) Int. Cl.
*H01L 23/34* (2006.01)

(52) U.S. Cl. .................. 257/723; 257/777; 257/773; 257/776; 257/788; 257/789; 257/E23.02; 257/E23.021; 257/E23.085

(58) Field of Classification Search ................ 257/737, 257/738, 723, 777, E23.021, E23.069, 685, 257/686, 726, E25.031–E25.032, E23.042, 257/E25.005, E25.006, E25.021, E25.027, 257/E23.085; 438/109, 110, 612–617, FOR. 368, 438/FOR. 426
See application file for complete search history.

(56) References Cited

U.S. PATENT DOCUMENTS

| 6,661,085 | B2 | 12/2003 | Kellar et al. |
| 7,056,807 | B2 | 6/2006 | Kellar et al. |
| 7,205,669 | B2 * | 4/2007 | Miyazaki .................. 257/777 |

OTHER PUBLICATIONS

Itoh, TI, et al., "Room Temperature Vacuum Sealing Using Surface Activated Bonding Method", The Univ. of Tokyo, National Inst. Of Advanced Industrial Science and Technology (AIST) (2003) IEEE; pp. 1828-1831.

* cited by examiner

*Primary Examiner*—Jasmine J Clark
(74) *Attorney, Agent, or Firm*—Scully, Scott, Murphy & Presser, P.C.; Vasken Alexanian

(57) ABSTRACT

A sealed microelectronic structure which provides mechanical stress endurance and includes at least two chips being electrically connected to a semiconductor structure at a plurality of locations. Each chip includes a continuous bonding material along it's perimeter and at least one support column connected to each of the chips positioned within the perimeter of each chip. Each support column extends outwardly such that when the at least two chips are positioned over one another the support columns are in mating relation to each other. A seal between the at least two chips results from the overlapping relation of the chip to one another such that the bonding material and support columns are in mating relation to each other. Thus, the seal is formed when the at least two chips are mated together, and results in a bonded chip structure.

3 Claims, 2 Drawing Sheets

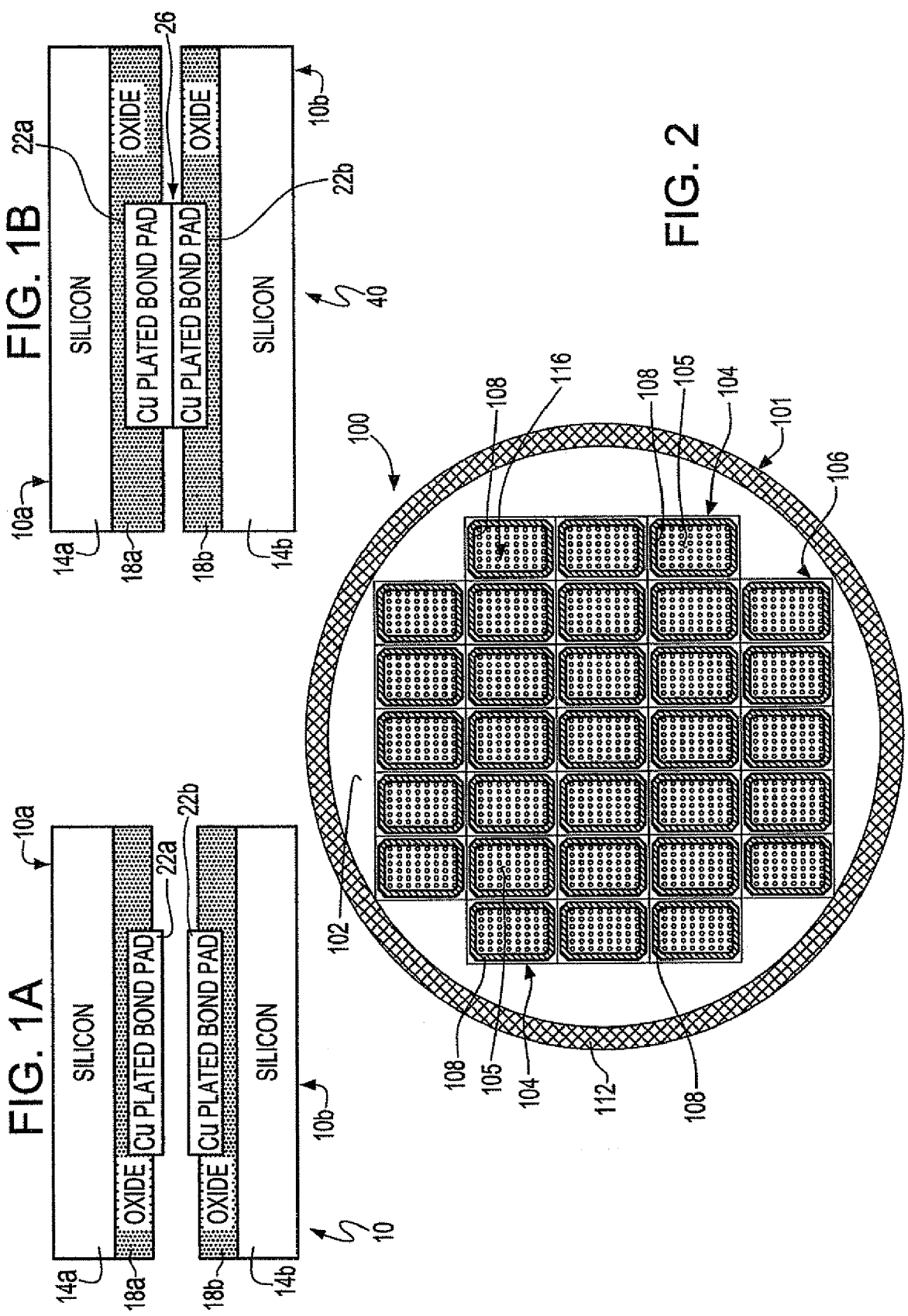

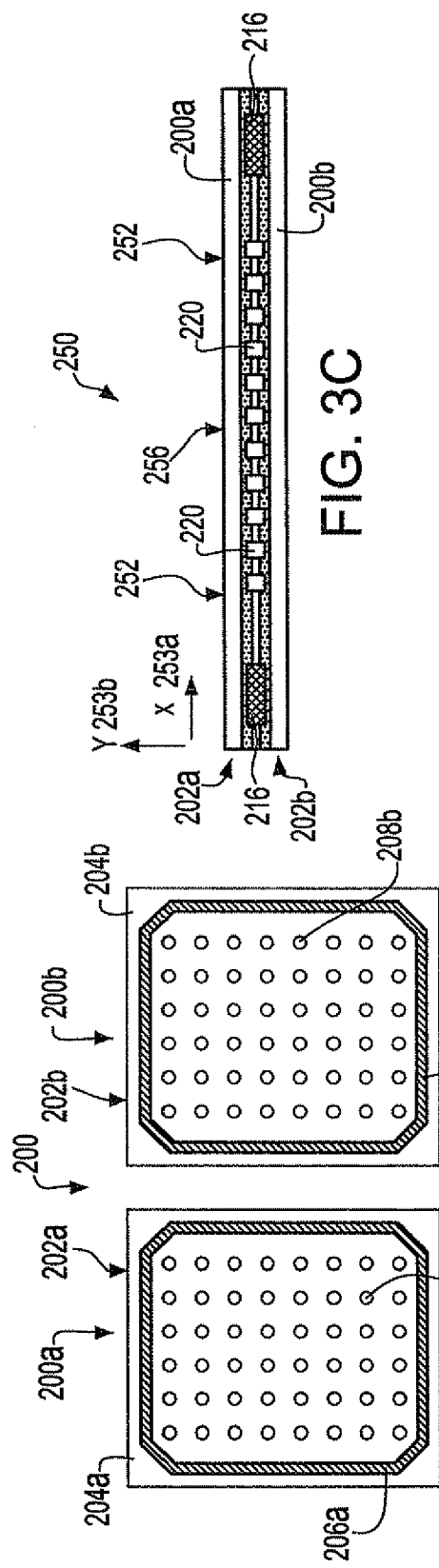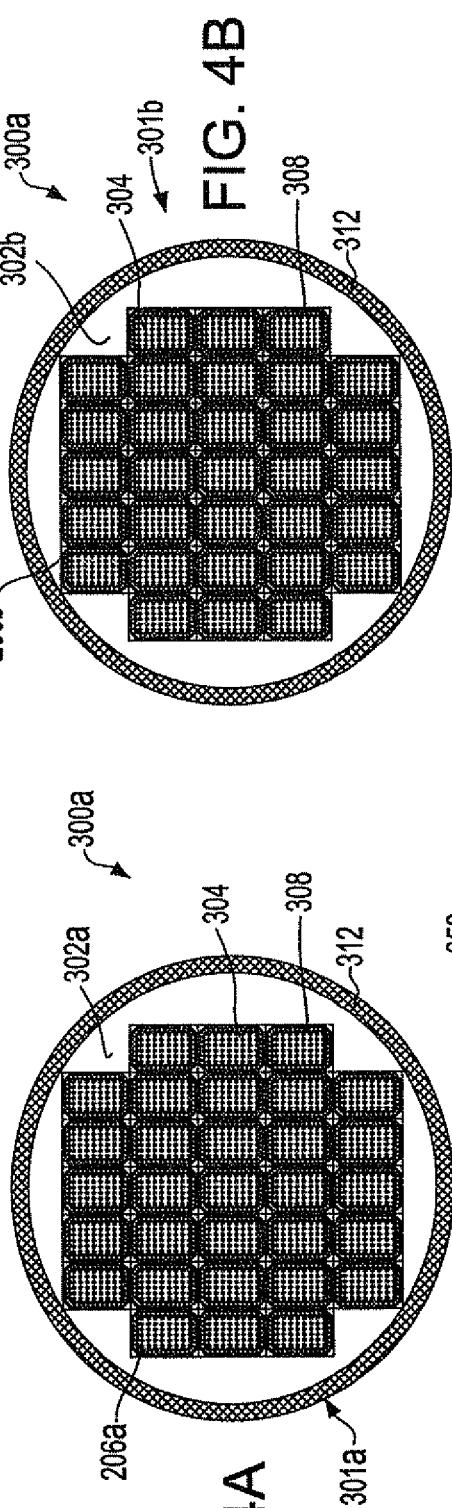

HERMETIC SEAL AND RELIABLE BONDING STRUCTURES FOR 3D APPLICATIONS

CROSS-REFERENCE TO RELATED APPLICATION

This application is a divisional application of U.S. patent application Ser. No. 11/534,366, filed on Nov. 3, 2006, entitled "HERMETIC SEAL AND RELIABLE BONDING STRUCTURES FOR 3D APPLICATIONS", which is hereby incorporated by reference in its entirety.

This invention was made with Government support under Contract No. N66001-00-C-8003 and N66001-04-C-8032 awarded by Defense, Advanced Research Projects Agency (DARPA). The Government has certain rights in this invention.

FIELD OF THE INVENTION

The present invention relates to a sealed semiconductor structure using a bonding technique and, more specifically, relates to a bonded sealed semiconductor structure including structural support elements.

BACKGROUND OF THE INVENTION

Integrated circuits (ICs) form the basis for many electronic systems. Essentially, an integrated circuit (IC) or chip includes a vast number of transistors and other circuit elements that are formed on a single semiconductor wafer and are interconnected to implement a desired function. The complexity of these integrated circuits (ICs) requires the use of an increasing number of linked transistors and other circuit elements.

Many modern electronic systems are created through the use of a variety of different integrated circuits, where each integrated circuit (IC or chip) performs one or more specific functions. For example, computer systems include at least one microprocessor and a number of memory chips. Conventionally, each of these integrated circuits (ICs) are formed on a separate chip, packaged independently and interconnected on, for example, a printed circuit board (PCB).

In microelectronics, a wafer is a thin slice of semiconducting material, such as a silicon crystal, upon which microcircuits are constructed for example, by doping, etching, or deposition. Wafers are used in the fabrication of semiconductor devices such as integrated circuits or chips or dies. A single wafer may have a plurality of chips formed on the wafer. The wafer may be used having a plurality of chips formed therein, or the wafer may be cut to provide individual dies or chips. The wafers and chips or dies can form a stack by positioning the wafers and/or chips on top of one another. Copper bonding (Cu bonding) processes can be used to stack dies/chips at a chip-to-chip, chip-to-wafer, or wafer-to-wafer level.

As integrated circuit (IC) technology progresses, a need for a "system on a chip" in which the functionality of all of the IC devices of the system are packaged together without a conventional printed circuit board (PCB). Ideally, a computing system should be fabricated with all the necessary IC devices on a single chip. In practice, however, it is very difficult to implement a truly high-performance "system on a chip" because of vastly different fabrication processes and different manufacturing yields for the logic and memory circuits.

As a compromise, various "system modules" have been introduced that electrically connect and package integrated circuit (IC) devices which are fabricated on the same or on different semiconductor wafers. Initially, system modules have been created by simply stacking two chips, e.g., a logic and memory chip, on top of one another in an arrangement commonly referred to as chip-on-chip structure. Subsequently, multi-chip module (MCM) technology has been utilized to stack a number of chips on a common substrate to reduce the overall size and weight of the package which directly translates into reduced system size.

Existing multi-chip module (MCM) technology provides performance enhancements over single chip or chip-on-chip (COC) packaging approaches. For example, when several semiconductor chips are mounted and interconnected on a common substrate through very high density interconnects, higher silicon packaging density and shorter chip-to-chip interconnections can be achieved. In addition, low dielectric constant materials and higher wiring density can also be obtained which lead to increased system speed and reliability, reduced weight, volume, power consumption, and heat to be dissipated for the same level of performance. However, MCM approaches still suffer from additional problems, such as, bulky packaging, wire length and wire bonding that gives rise to stray inductances which interfere with the operation of the system module.

Typically, optimization of Cu bonding was achieved by utilizing one pattern density with specific bond pad dimensions and/or via dimensions. Vias and electrically connected pads refer to vias/pads with a plated hole that connects conductive tracks from one layer of a chip to another layer(s). Current solutions are not compatible with standard CMOS processes in which a variety of pattern densities and pad/via sizes may be used. Additionally, due to mechanical stability issues most of the bonding fails occur at the edge of the bonded pattern which often, in addition to degraded bonding yield, leads to corrosion issues. Additionally, for 3D applications, a method or device is needed to provide additional protection from mechanical damage (such as crack propagation, chipping, dicing, etc.) caused during the semiconductor fabrication process.

In the current state of the art, electrically active bonded pads and/or vias had to be often placed in the central location of the pattern to provide good reliability for these contacts. One major challenge of three dimensional (3-D) wafer-to-wafer vertical stack integration technology is the metal bonding between wafers and between die in a single chip, and the wafer protection from possible corrosion and contamination caused or generated, by process steps after the wafers are bonded from reaching active IC devices on the bonded wafers.

Therefore, a need exists to erect a barrier structure by the edge of bonded wafers and individual die to protect the bonded wafers and die against corrosion and contamination in a three-dimensional (3-D) wafer-to-wafer vertical stack. It would also be desirable to provide an improved metal bonding method having acceptable bonding yield and reliability without being limited to pattern density or pad/via dimensions.

SUMMARY OF THE INVENTION

In an aspect of the invention, a sealed microelectronic structure providing mechanical stress endurance is provided which comprises at least two chips including and being electrically connected to a semiconductor structure and comprising outer edges. Each chip includes a continuous length of bonding material on a planar surface area thereof defining a perimeter in spaced adjacency to the outer edge. At least one support column is connected to each of the chips and positioned within the perimeter of each chip. Each support column extends outwardly such that when the at least two chips are positioned in overlapping relation to one another, opposing support columns mate with each other or with an opposing planar surface area on the overlapping chip. A seal between the at least two chips results from the at least two chips being positioned in overlapping relation to one another such that the bonding material on each chip is in mating relation to each other whereby the seal is formed when the at least two chips are mated together resulting in a bonded chip structure.

In a related aspect of the invention, the bonding material on the at least two chips is compressed and the bonding material is heated to form the seal.

In another related aspect of the invention, a plurality of chips are positioned on at least two wafers. The wafers each include a continuous bonding material along a perimeter substantially adjacent to an outer edge of the wafer. The at least two wafers are sealed together when the bonding material on each of the wafers is compressed on each other in mating relation and heated to form the seal.

In another related aspect of the invention, the chips are electrically connected to their respective substrates to form an electrical circuit on the chips and the support columns are non-electrical and thereby are not part of the electrical circuit.

In another related aspect of the invention, the chips are electrically connected to their respective substrates and electrical connected to their respective wafers to form an electrical circuit on the chips and the wafers and the support columns are non-electric and thereby not part of the electrical circuit.

In another related aspect of the invention the chips have multiple layers and the support columns are positioned between the layers and adapted to provide support between the layers.

In an aspect of the present invention, a method for sealing a microelectronic structure and providing mechanical stress endurance comprises providing at least two chips including and being electrically connected to a semiconductor structure at a plurality of locations. A length of continuous bonding material is deposited on each chip on a planar surface thereof defining a perimeter substantially adjacent to the outer edge. At least one support column is connected on each of the chips and within the perimeter of each chip, and each support column extends outwardly. The chips are positioned in overlapping relation such that the bonding material and the support columns are in mating relation to each other. The chips are compressed and thereby the bonding material is also compressed together. The bonding material is heated to form a seal about the perimeter of the chips whereby a bonded chip structure is formed.

In a related aspect of the invention, a plurality of chips are positioned on at least two wafers, and a bonding material is deposited along a perimeter adjacent to an outer edge of the wafer. The bonding material is compressed on each of the wafers together with each other in mating relation, The mated bonding material is heated to form a seal, thereby forming a bonded wafers structure.

BRIEF DESCRIPTION OF THE DRAWINGS

These and other objects, features and advantages of the present invention will become apparent from the following detailed description of illustrative embodiments thereof which is to be read in connection with the accompanying drawings, in which:

FIG. 1A is a block diagram according to an embodiment of the invention depicting a unbonded silicon wafers and Cu plated bond pads;

FIG. 1B is a block diagram of the silicon wafers and Cu plated bond pads shown in FIG. 1A bonded together;

FIG. 2 is plan view of a wafer including a plurality of chips with bonding material around the perimeter of the chips and the perimeter of the wafer;

FIGS. 3A and 3B is a plan view of two wafers depicting a bonding material around their perimeters and having a plurality of bonding pads;

FIG. 3C is a cross sectional view of the wafers shown in FIGS. 3A and 3B bonded together;

FIGS. 4A and 4B are a plan view of two wafers including a plurality of chips wherein the wafers and the chips have bonding material on their perimeters;

FIG. 4C is a perspective view of the wafers shown in FIGS. 4A and 4B bonded together; and FIG. 4D is a cross sectional view along line X-X of the bonded wafers shown in FIG. 4C.

DETAILED DESCRIPTION OF THE INVENTION

Generally, the present invention provides the ability to seal chip/structures/wafers which enables mechanical stability of critical joined components and protects from outside environmental damage. The sealing procedure of the present invention for sealing stacked wafer or chips enables structures to be hermetically sealed at a chip/die level and also allows wafer-level sealing which will enable downstream full-wafer processing. Furthermore, the sealing solution can also be utilized for electrical signal propagation and thermal dissipation or as a thermal conductor (through sealant material itself or using sealant as a thermal structure for dissipation). Materials that can be used to seal together chips or wafers include: metals (for example: Cu—Cu, Au—Au, etc.); alloys (such as: Cu—Sn, AuSn, etc.); solders; dielectrics (oxide-oxide); conductive adhesives (Cu-loaded pastes) and any combination thereof (example indium-oxide).

More specifically, referring to FIG. 1A, for illustrative purposes, two silicon wafers 10 are shown. A first silicon wafer 10a is positioned over a second silicon wafer 10b. Each silicon wafer may include a plurality of electrical elements fabricated using known semiconductor fabricating techniques on a top surface and/or in an upper layer of the wafer or a chip. Further, the electrical elements can be connected to each other and to electrically conductive vias extending throughout the wafer or chip and/or a substrate portion of the wafer or chip forming multiple circuits to provide, for example, power, connectivity, or circuit logic. The first silicon wafer 10a includes a silicon layer 14a and an oxide layer 18a. Similarly, the second silicon wafer 10b includes a silicon layer 14b and an oxide layer 18b in mirror image relationship to the first silicon wafer 10a. Further, the first silicon wafer 10a includes a copper (Cu) plated bond pad 22a, and the second silicon wafer 10b also includes a copper (Cu) plated bond pad 22b. The bond pads 22a and 22b are positioned in mating relationship to each other.

Referring to FIG. 1B, the first silicon wafer 10a and second silicon wafer 10b are bonded together at a bonded area 26 using the copper plated bond pads 22a, 22b of silicon layers 14a, 14b. The bonded area 26 formed by compressing the first and second silicon wafer 10, 10b together. Heat is also applied to the bonded area 26 to form the bond and seal the wafers 10a, 10b together. Thus, the first and second silicon wafers 10a, 10b are positioned in mating relation, as shown in FIG. 1A, and the Cu plated bonding pads 22a, 22b are mated together and sealed by using compression and heat. The bonded structure is preferably hermetically sealed, i.e., an airtight seal, which is intended to secure against the entry of unwanted particles and elements to maintain the quality of the electrical components and circuitry in the bonded structure. Other material may be used other than cooper to accomplish the sealing bond. Further, the seal prevents corrosion from atmosphere (humidity or temperature) or foreign materials (contamination) and wet chemistry reaction and plasma damage from BEOL/Packaging processes.

Referring to FIG. 2, a silicon wafer 100 is shown having a plurality of integrated circuits (ICs or chips) 104 positioned on a planar surface area 102 of the wafer 100. Each of the chips 104 includes a bonding material 108 forming a perimeter on a planar surface area 105 of the chip 104. The wafer 102 also has bonding material 112 forming a perimeter on the planar surface area 102. In the embodiment of the invention shown in FIG. 2, the bonding material is copper, however, other suitable electrically conductive or non-conductive materials may be used. It is understood, that the chip and wafer perimeters formed by the bonding materials 108, 112, respectively, may begin from outer edges 106, 101, respectively, and extend radially inwardly from the outer edges along the planar surface areas 105, 102, respectively, of the chips 104 and the wafer 100. Further, the chip and wafers perimeters formed by the bonding materials 108, 112 can also be adjacent, offset, or in spaced adjacency from the outer edges 106, 101, respectively.

The chips 104 also include dummy bonding pads (pads, support columns/pillars) 116 (shown in FIG. 2), which may be made of copper or other suitable materials. The pads or copper pad (support columns/pillars) 116 are structures without any electrical connection, but have a specified position on the planar surface area 105 of the chip 104 and a specified height to contact mating pads on a chip (not shown) to be fitted over the chip 104 shown in FIG. 2. The mating pads then form a structural column or support column (or pillar) in a sealed bonded structure of wafers or separate chips. The mating pads can also be bonded together when the wafer of chip is mated, thus forming a bonded support column. The mating pads 116 help support the wafer when stacked with other wafers, as will be discussed herein referring to FIG. 3C.

Referring to FIGS. 3A and 3B, a pair of chips 200 are shown in mirror image relation. A first chip 200a and second chip 200b each have planar surface areas 204a, 204b, respectively. Bonding materials 206a, 206b, respectively, define perimeters around the surface areas 204a, 204b, respectively, on the first and second chips 200a, 200b. As discussed in relation to FIG. 2, the bonding material may be cooper, as well, as other suitable materials. The perimeters defined by the bonding materials 206a, 206b extend inwardly along the planar surface areas 204a, 204b, respectively, from outer edges 202a, 202b, respectively.

The chips 200a, 200b also include dummy bonding pads 208a, 208b, respectively (similarly to the chips 104 shown in FIG. 2), which may be made of copper or other suitable materials as discussed in regard to pads 116 on chip 104 in FIG. 2. Similarly to chip 104 shown in FIG. 2, the pads 208a, 208b shown in FIGS. 3A, 3B are structures without any electrical connection, but have a specified position on the planar surface areas 204a, 204b of the chips 200a, 200b, respectively. The bonding pads 212A, 212B may be placed in a geometric pattern, as shown in FIGS. 3A and 3B, but also may be placed in any pattern, or non-pattern desired, or in any quantity desired.

Each of the pads 208a on chip 200a have a specified height to contact mating pads 208b on chip 200b when the chips 200a, 200b are placed in overlapping relation and bonded as shown in FIG. 3C. The pads 208a, 208b coupled (or bonded or fused) together form mated pads 220 or structural columns, show in FIG. 3C, in the bonded chip structure 250, as shown in FIG. 3C. Further, the bonded chip structure 250 comprises a bonded perimeter 216 consisting of bonding material 206a and bonding material 206b mated together. In the bonded chip 250 (shown in FIG. 3C), the bonding material 206a, 206b shown in FIGS. 3A and 3B are affixed together to form a seal 216 around the perimeter of the bonded chip 250. The forming of the seal 216 includes compressing the bonding material together and heating the bonding material. Other methods of forming the seal are also contemplated and within the scope of the present invention. The seal 216 stops unwanted entry of for example, materials, substances, or debris into the bonded chip 250, i.e., between the chips 300a and 300b.

Referring to FIG. 3C, the wafers 200a, 200b are shown bonded together as a bonded chip structure 250, in cross-section, so that the mated pads or structural columns 220 are shown. The mated pads or structural columns 220 are the pads (or dummy pads) 212a on first wafer 200a and second wafer 200b mated together. The dummy pads mated together to form structural columns 220 provide strength to the bonded wafer 250. The pads 220 help support the surface areas 204a and 204b of the first and second wafers 200a, 200b, respectively. The surface areas 204a, 204b have an inherent weight, and thus there are axial forces 252 across the surface areas 204a, 204b perpendicular to the "X" axis 253a and along the "Y" axis 253b. More particularly, the axial forces 252 are from, for example, the inherent weight of the surface areas 204a, 204b of the first and second wafers 200a, 200b due to gravitation forces, or axial force (or pressure) from the weight of other chips (or wafers) stacked on the bonded chip 250. The structural columns 220 provide support along the surface areas 204a, 204b of the first and second chips 200a, 200b, respectively, to support the axial forces. More specifically, when additional chips are stacked over each other, additional axial forces from the weight of additional chips bear down (along the "Y" axis 253b) on the outer top surface 256 of the bonded wafer 250. Further, the mated pads/structural columns 220 help to stabilize the bonded wafer 250 against torsional forces (or stresses), which may occur in the processing or fabricating of the wafer or from disproportionate weight distribution from stacking other chips (or wafers) over one another such that twisting or bending occurs along the surface areas 204a, 204b of the chips 200a, 200b. If torsional stresses are applied to the bonded chip 250, the torsion causes twisting of the bonded chip 250 that may result in shearing stress which are perpendicular to surface areas 204a, 204b (in the "Y" direction 253b). Thus, in one example, the structural columns may be positioned on the surface area of a chip or wafer in an area unpopulated by other components to effectively distribute axial and torsional forces throughout the chip or wafer during processing. Distribution of forces throughout the chip or wafer lessens the force in one particular area and thereby reduces the stress in that area lessening the likelihood of a stress related fracture or break in the chip or wafer structure. Also, the support columns reduce possible stresses from torsion and axial loads on the seal. Further, an uncompromised seal (preferably a hermetic seal) about each chip or wafer prevents, for example, liquid and gas etchants/corrosives and particulate materials from ingressing into areas which will be damaged by such ingress.

It is understood that a chip or wafer may have multiple electrical reference layers connected by vertical vias (not shown). The dummy pads, for example, as described in relation to FIGS. 3A-3C, can be positioned between layers in the chip or wafer to provide support between the layers, as well as providing support between the chips or wafers themselves.

Referring to FIGS. 4A and 43, wafers 300a, 300b, respectively, include a plurality of chips 304 positioned on surface areas 302a, 302b. The surface areas of the wafers 300a, 300b include bonding material 312 forming a perimeter around the wafers 300a, 300b with a thickness 320 (shown in FIG. 4D) starting from the edge of the wafers 301a, 301b and extending inwardly on the surface areas 302a, 302b of the wafers 300a, 300b. The chips 304 on the surface areas 302a, 302b of the wafers 300a, 300b include dummy pads 208a, 208b as depicted in more detail in FIGS. 3A and 3B, and described above. Further, the chips 304 on wafers 300a, 300b include bonding material 206a, 206b, respectively, defining a perimeter around the chip 304 as shown in more detail in FIGS. 3A and 3B, and described above.

Wafers 300a and 300b are combined by positioning one wafer over the other to form bonded wafer 350, shown in FIG. 4C. In the bonded wafer 350, the bonding material 312 shown in FIGS. 4A and 4B are affixed together to form a seal 312 around the perimeter of the bonded wafer 350. The forming of the seal includes compressing the bonding material 312 between the wafers 300a, 300b and heating the bonding material 312 to form the bonded seal 316. The bonded seal 316 stops unwanted entry of, for example, materials, substances, or debris into the bonded wafer 350, i.e., between the wafers 300a and 300b.

Referring to FIG. 4D, a cross-section of the combined wafers 350 is shown along line X-X to show the bonded seal 316, resulting from bonding together of bonding material 312 on each wafer 300a, 300b, extending inwardly from the edges 301a and 301b of the wafers 300a, 300b. The bonded seal 316 around the perimeter of the wafer 350 is shown in FIG. 4D.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A sealed microelectronic structure providing mechanical stress endurance, which comprises:
    a plurality of chips positioned on at least two wafers and the chips being electrically connected to a semiconductor structure, and the chips comprising outer edges;
    each chip including a continuous length of bonding material on a planar surface thereof defining a perimeter in spaced adjacency to the outer edge;
    at least one support column connected to each of the chips and positioned within the perimeter of each chip, and each support column extending outwardly such that when the at least two chips are positioned in overlapping relation to one another such that opposing support columns mate with each other or with an opposing planar surface area on the overlapping chip;
    a seal between the at least two chips resulting from the at least two chips being positioned in overlapping relation to one another such that the bonding material on each chip is in mating relation to each other whereby the seal is formed when the at least two chips are mated together resulting in a bonded chip structure;
    continuous bonding material being positioned along a perimeter adjacent to an outer edge of the wafer, and the at least two wafers being sealed together when the bonding material on each of the wafers is compressed on each other in mating relation and heated to form the seal; and
    the chips being electrically connected to their respective substrates and electrical connected to their respective wafers to form an electrical circuit on the chips and the wafers, and the support columns being electrically disconnected from the electrical circuit.

2. The structure of claim 1, wherein the bonding material on the plurality of chips is compressed and the bonding material is heated to form the seal.

3. The structure of claim 1, wherein the chips have multiple layers and the support columns are positioned between the layers and adapted to provide support between the layers.

* * * * *